United States Patent
Kumamoto et al.

(10) Patent No.: US 9,837,027 B2
(45) Date of Patent: Dec. 5, 2017

(54) SEMICONDUCTOR DEVICE (71) Applicant: Synaptics Japan GK, Tokyo (JP)

(72) Inventors: Akihito Kumamoto, Tokyo (JP); Kazuo Nishimae, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 20 days.

(21) Appl. No.: 14/972,660

(22) Filed: Dec. 17, 2015

(65) Prior Publication Data

US 2016/0187422 A1 Jun. 30, 2016

(30) Foreign Application Priority Data

Dec. 26, 2014 (JP) .................................. 2014-263772

(51) Int. Cl.
| | |
|---|---|
| G01R 31/28 | (2006.01) |
| G09G 3/36 | (2006.01) |
| G09G 3/00 | (2006.01) |
| G01R 31/317 | (2006.01) |

(52) U.S. Cl.
CPC ......... G09G 3/36 (2013.01); G01R 31/31724 (2013.01); G09G 3/006 (2013.01)

(58) Field of Classification Search
CPC ..... G09G 3/36; G09G 3/006; G01R 31/31724
See application file for complete search history.

(56) References Cited

U.S. PATENT DOCUMENTS

| | | | | |
|---|---|---|---|---|
| 2007/0171229 | A1* | 7/2007 | Mamiya | G06F 3/1446 345/503 |
| 2007/0226558 | A1* | 9/2007 | Ikeda | G01R 31/31705 714/724 |
| 2009/0147145 | A1* | 6/2009 | Lee | H04N 5/44504 348/725 |
| 2010/0088484 | A1* | 4/2010 | Roohparvar | G11C 7/1018 711/168 |
| 2011/0252354 | A1* | 10/2011 | Mimatsu | G06F 3/0607 715/771 |
| 2013/0198437 | A1* | 8/2013 | Omizo | G06F 12/0246 711/103 |
| 2015/0026449 | A1* | 1/2015 | Heo | G06F 12/0246 713/2 |

FOREIGN PATENT DOCUMENTS

JP 2003315423 A 11/2003

* cited by examiner

*Primary Examiner* — Thien D Nguyen
(74) *Attorney, Agent, or Firm* — Patterson + Sheridan, LLP (57) ABSTRACT The semiconductor device cyclically outputs given status information pieces according to a predetermined procedure from a test output terminal one by one on receipt of a test enable direction through a test enable terminal, and outputs the same status information pieces as those output at that time from the test output terminal without interruption on receipt of a test disable direction. Operating the test enable terminal, the semiconductor device cyclically outputs status information pieces without the need for initial setting and further, outputs only desired status information without interruption.

15 Claims, 6 Drawing Sheets

Fig.2

| COUNT VALUE OF COUNTER | DATA NAME |
|---|---|
| 0 | HD | ~ 90
| 1 | ALMID0[7:0] | ~ 71_1
| 2 | ALMID1[7:0] | ~ 71_2
| 3 | ALMID2[7:0] | ~ 71_3
| 4 | ALMID3[7:0] | ~ 71_4
| 5 | ALMID4[7:0] | ~ 71_5
| 6 | DDB16[7:0] | ~ 70_1
| 7 | DDB17[7:0] | ~ 70_2
| 8 | DDB18[7:0] | ~ 70_3
| 9 | DDB19[7:0] | ~ 70_4
| 10 | DDB20[7:0] | ~ 70_5
| 11 | DDB21[7:0] | ~ 70_6
| 12 | DDB22[7:0] | ~ 70_7
| 13 | P7-0 | ~ 60
| 14 | gpm[7:0] | ~ 61
| 15 | FT | ~ 91

Fig.6

SEMICONDUCTOR DEVICE

CROSS-REFERENCE TO RELATED APPLICATIONS

This application claims priority from Japanese application JP 2014-263772 filed on Dec. 26, 2014, the content of which is hereby incorporated by reference into this application.

BACKGROUND

The present invention relates to a technique for facilitation of a test and a debug on a semiconductor device. Further, it relates to a technique useful in application to a semiconductor device, e.g. an LC driver.

Examples of the literature covering a technique for facilitation of a test and a debug on a semiconductor device include Japanese Unexamined Published Patent Application No. JP-A-2003-315423, which discloses a liquid crystal controller arranged to input/output internal debug information from/to JTAG (Joint European Test Action Group). Further, in JP-A-2007-148754, there is a description concerning a technique for debug facilitation by which a boundary scan is executed according to initial settings on a TAP (Test Access Port) controller, and desired internal information pieces from CPU or another processing circuit are output through a debug terminal.

Prior to the invention, the inventor was examined on the patent documents: JP-A-2003-315423; and JP-A-2007-148754.

SUMMARY

A semiconductor device and a method of using the same are provided. In one example, a semiconductor device includes a processing part, a control part, a first register part and a test control part. The processing part is configured to process data input through an interface part, and outputs resultant data. The control part is configured to control the processing part based on control data input through the interface part. The first register part is configured to receive status information pieces from the interface part and the control part parallel on condition that the processing part is in action. The test control part is configured to perform control so as to repeat selecting status information pieces held by the first register part in series and configured to output, from a test output terminal, the selected status information pieces according to a predetermined output format one by one on receipt of a test enable direction through a test enable terminal. The test control part is also configured to perform control so as to output the same status information pieces as those output before suspension from the test output terminal without interruption with the series selection of the status information pieces suspended on receipt of a test disable direction through the test enable terminal.

In another example, a semiconductor device includes a processing part, a control part, a first register part, a second register part, and a test control part. The processing part is configured to process data input through an interface part, and configured to output resultant data. The control part is configured to control the processing part based on control data input through the interface part. The first register part is configured to receive status information pieces from the interface part and the control part in parallel on condition that the processing part is in action. The second register part is configured to store individual information pieces unique to the semiconductor device. The test control part is configured to perform control so as to repeat selecting status information pieces held by the first register part, and the individual information pieces held by the second register part in series and outputting the selected information pieces from a test output terminal one by one according to a predetermined output format on receipt of a test enable direction through a test enable terminal. The test control part is also configured to perform control so as to output the same status information pieces or individual information pieces as those output before suspension from the test output terminal without interruption with the series selection of the status and individual information pieces suspended on receipt of a test disable direction through the test enable terminal.

In yet another example, a method operating an LCD driver is provided that includes outputting, from a processing part, data to an LCD display; receiving, while the processing part is outputting image data, in parallel status information pieces in a first register part from an interface part and a control part; receiving, while the processing part is outputting image data, individual information pieces in a second register part corresponding to information pieces present in a non-volatile memory; in response to receipt of a test enable direction, outputting in series status information pieces held by the first register part and individual information pieces held by the second register part according to a predetermined output format to an output terminal; and in response to receipt of a test disable direction, outputting individual information pieces held by the second register part while suspending output of status information pieces held by the first register part to the output terminal.

DETAILED DESCRIPTION

<Introduction>

In a boundary scan according to JTAG, which is a technique for facilitation of a test and a debug (collectively, referred to as test facilitation, in short) on a semiconductor device, it is necessary to make initial settings on a TAP controller in advance. It is required to make initial settings according to what to verify, e.g. what internal node of what internal circuit must be targeted for scan, and with what timing internal information should be sampled.

However, the inventor has shown that in the case of adopting a versatile circuit for test facilitation for a device smaller in circuit scale in comparison to a microcomputer and a large-scale device arranged in a system-on-chip form, and a device restricted in data processing function as in boundary scan according to JTAG, its circuit scale can be made larger, and the length of time for initial setting can be made longer.

It is an object of the invention to provide a semiconductor device which is small in the scale of a circuit for test facilitation, and shorten the time for the initial setting of actions required for a test and a debug.

The above and other objects of the invention, and novel features thereof will become apparent from the description hereof and the accompanying diagrams.

Of the embodiments disclosed in this application, the representative embodiment will be briefly outlined below.

A semiconductor device according to the embodiment cyclically outputs internal status information pieces and others from a test output terminal in a predetermined order in response to "Test Enable", and it outputs the same status information pieces and other information pieces as those output at that time from the test output terminal without interruption in response to "Test Disable".

(1) More specifically, the semiconductor device includes: a processing part which processes data input through an interface part, and outputs the resultant data; a control part which controls the processing part based on control data input through the interface part; a first register part to which status information pieces in the interface part and the control part are transmitted in parallel on condition that the processing part is in action; and a test control part which performs control so as to repeat the action of selecting status information pieces held by the first register part in series and outputting, from a test output terminal, the selected status information pieces according to a predetermined output format one by one on receipt of a test enable direction through a test enable terminal, and performs control so as to output the same status information pieces as those output before suspension from the test output terminal without interruption with the series selection of the status information pieces suspended on receipt of a test disable direction through the test enable terminal. According to this embodiment, on condition that "Test Enable" is specified, the semiconductor device cyclically outputs given status information pieces from a test output terminal according to a predetermined procedure one by one. On condition that "Test Disable" is specified, the semiconductor device outputs the same status information pieces as those output from the test output terminal at that time without interruption. Therefore, only operating a test enable terminal without the need for initial setting, the semiconductor device can cyclically output status information pieces, or output only a desired status information piece without interruption. This can contribute to the test facilitation of a semiconductor device.

The test control part has e.g. a sequencer, a counter and a selector. The sequencer causes the counter to perform a counting action according to a wraparound technique in response to the test enable direction, and causes the counter to suspend the counting action in response to the test disable direction. A count value of the counter is used to specify memory regions of status information pieces held by the first register part. The selector selects the memory region specified by the count value, and reads out the status information piece from the first register part.

Under the test control part receives, the first register part has the status information pieces, which internal registers of the interface part and the control part hold, input to the memory regions unique thereto through respective exclusive-use signal lines. Therefore, the first register part can accept the input of the status information pieces held by internal registers of the interface part and the control part one by one, and hold the status information pieces dynamically.

The predetermined output format in the test control part is a format arranged by adding a header information piece to the top of a group of the status information pieces selected from the first register part in each selection round and a footer information piece to the end of the group. Therefore, even in the case of repeatedly outputting the status information pieces selected from the first register part in each selection round, it is possible to easily make a discrimination among the respective status information pieces from the header and footer information pieces.

The processing part outputs e.g. display drive signals for displaying an image on a liquid crystal display panel based on image data input from the interface part. In this case, the semiconductor device is formed as e.g. a LCD (Liquid Crystal Display) driver.

The test control part enables a direction received through the test enable terminal on condition that a mode signal for specifying an internal mode of the semiconductor device is in a predetermined state, for example.

(2) Another semiconductor device includes, for example: a processing part which processes data input through an interface part, and outputs the resultant data; a control part which controls the processing part based on control data input through the interface part; a first register part to which status information pieces in the interface part and the control part are transmitted in parallel on condition that the processing part is in action; a second register part in which individual information pieces unique to the semiconductor device are stored; and a test control part which performs control so as to repeat the action of selecting status information pieces held by the first register part, and the individual information pieces held by the second register part in series and outputting the selected information pieces from a test output terminal one by one according to a predetermined output format on receipt of a test enable direction through a test enable terminal, and performs control so as to output the same status information pieces or individual information pieces as those output before suspension from the test output terminal without interruption with the series selection of the status and individual information pieces suspended on receipt of a test disable direction through the test enable terminal. In the case of the semiconductor device, information pieces to output from the test output terminal are expanded to individual information pieces other than status information pieces. The individual information pieces may be information pieces which can be used in the failure analysis of the semiconductor device or the like, and which include e.g. a lot number of a wafer used in manufacturing the semiconductor device and a chip address on the wafer.

In the semiconductor device, the test control part has a sequencer, a counter and a selector. The sequencer causes the counter to perform a counting action according to a wraparound technique in response to the test enable direction, and causes the counter to suspend the counting action in response to the test disable direction. A count value of the counter is used to specify memory regions of status information pieces and unique information pieces held by the first and second register parts. The selector selects the memory region specified by the count value, and reads out the status information piece from the first register part or reads out the unique information piece from the second register part.

Under the test control part, the first register part has the status information pieces, which internal registers of the interface part and the control part hold, input to the memory regions unique thereto through respective exclusive-use signal lines one by one.

The individual information pieces from a nonvolatile memory device are initially set on the second register part by e.g. a power-on reset process of the semiconductor device.

The predetermined output format in the test control part is a format arranged by adding a header information piece to the top of a group of the status and individual information pieces selected from the first and second register parts in each selection round and a footer information piece to the end of the group.

The processing part outputs e.g. display drive signals for displaying an image on a liquid crystal display panel based on image data input from the interface part.

The test control part enables a direction received through the test enable terminal on condition that a mode signal for specifying an internal mode of the semiconductor device is in a predetermined state, for example.

In the invention disclosed in this application, the effect achieved by the representative embodiment will be briefly described below.

The following are made possible: to decrease the circuit scale for test facilitation and debug facilitation for a semiconductor device; and to shorten the time for the initial setting of actions required for a test and a debug.

First Embodiment

Figure 1:
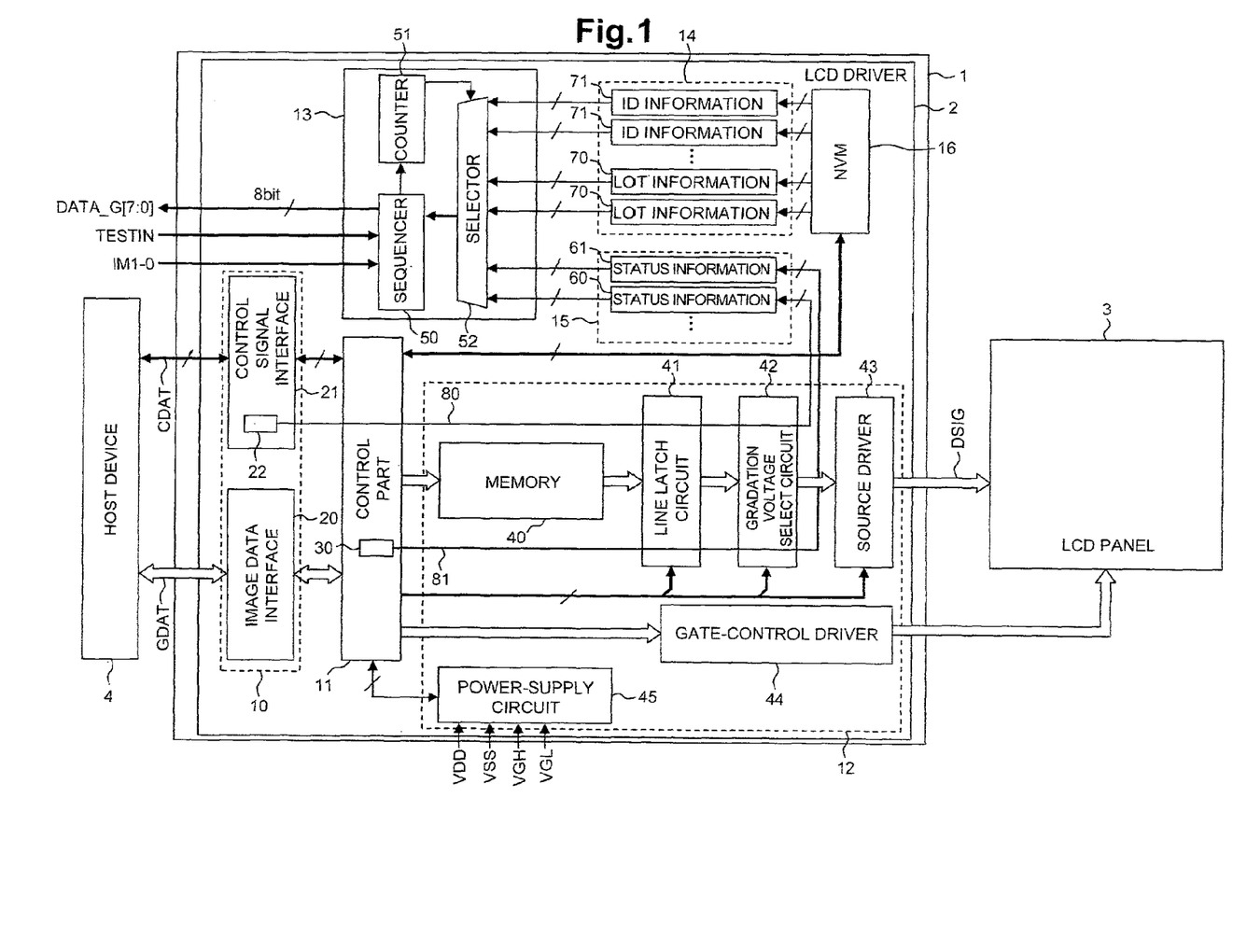
FIG. 1 is a block diagram showing, by example, a semiconductor device according to the invention.

FIG. 1 shows an example of the semiconductor device according to the invention. Although no special restriction is intended, the semiconductor device 1 shown in the diagram has an LCD driver 2. The semiconductor device 1 is formed on a semiconductor substrate of monocrystalline silicon or the like by e.g. a known CMOS integrated circuit manufacturing technique.

The LCD driver 2 has e.g. a control signal interface 21 and an image data interface 20 as interface parts 10 for receiving processing data and control signals from the outside. The control signal interface 21 receives control data CDAT from a host device 4. The image data interface 20 receives image data GDAT from the host device 4. The control signal interface 21 and the image data interface 20 input and output information according to a predetermined interface protocol. For instance, an interface protocol compliant with MIPI (Mobile Industry Processor Interface)-DBI (Display Bus Interface) is adopted for the control signal interface 21, which inputs and outputs control data in parallel. An interface protocol compliant with MIPI-DSI (Display Serial Interface) is adopted for the image data interface 20, which outputs image data serially.

The LCD driver 2 has a processing part 12 and a control part 11 as main circuits for performing the display/drive of an LCD panel 3. The processing part 12 processes image data GDAT input through the image data interface 20 and outputs the resultant data. The control part 11 controls the processing part 12 based on control data CDAT input through the control signal interface 21. More specifically, the control part 11 includes: various control registers on which control information pieces, such as a clock frequency, the number of horizontal scan lines, the number of vertical signal lines, and a display position, are set according to the size and the display performance of the LCD panel 3; and a command decoder. The control part 11 decodes a command supplied to the control signal interface 21 by the host device 4, and performs the writing on the control registers according to the result of the decoding. Also, the control part takes image data supplied to the image data interface 20 in the processing part 12, and performs e.g. display control based on the image data thus taken. The processing part 12 includes: a gate-control driver 44 which sequentially drives horizontal scan lines of the LCD panel 3 of e.g. TFT type; and a source driver 43 which supplies the pixels selected through the driven horizontal scan lines with pixel drive signals DSIG serving as display drive signals through the vertical signal lines. The control part 11 provides a timing for driving the horizontal scan lines to the gate-control driver 44 according to the display timing; and a power-supply circuit 45 supplies a drive voltage at that time. The processing part 12 has a line latch circuit 41 and a gradation voltage select circuit 42 which are provided as stages preceding the source driver 43. Image data supplied through the image data interface 20 are stored in a frame memory 40 e.g. by display frame. In the processing part 12, pixel data of one scan line are transmitted from the frame memory to the line latch circuit 41 in every scan-line-driving period. The gradation voltage select circuit 42 selects, in pixels, gradation voltages according to the pixel data thus transmitted. The source driver 43 drives the vertical signal lines by use of the selected gradation voltages. In this way, the display of image data on the LCD panel 3 is controlled for each display frame. The gradation voltages are produced by the power-supply circuit 45. In addition to a source voltage VDD used as an operation power source of a logic circuit and a ground voltage VSS, e.g. a positive polarity-term voltage VGH and a negative polarity-term voltage VGL, both for producing gradation voltages are input to the power-supply circuit 45.

Now, the structure for facilitation of a test on the LCD driver 2 will be described. Although no special restriction is intended, particular information pieces to make reference to, which are considered to be desirable for the test facilitation, include: status information held by an error register 22 in the control signal interface 21; and status information held by a status register 30 in the control part 11. The error register 22 holds, as status information, e.g. the number of errors in each packet owing to data communication in the control signal interface 21 in real time. The status register 30 holds e.g. a display mode for the LCD panel 3 and a control mode of the LCD driver 2, which are specified by commands from the host device 4 as status information in real time. It is a basic object of the test or debug facilitation to enable the real-time reference to the status information as described above from the outside with the LCD driver 2 working under the display control. If it is attempted to make reference to the error register 22 and the status register 30 through the control signal interface 21, the test timing and the debug timing must be controlled so as to avoid the contention of the action of making reference with the action of display control, and that neither the real-time test nor the real-time debug can be performed in parallel with the action of display control is also presumed.

Hence, the LCD driver 2 has a first register part 15 to which status information pieces of the error register 22 and the status register 30 are transmitted in parallel while the processing part 12 is in action. The first register part 15 has: a specific memory region 60 for storing status information which the error register 22 holds; and a specific memory region 61 for storing status information which the status register 30 holds. The first register part 15 is connected with the error register 22 and the status register 30 through exclusive-use signal lines 80 and 81; and required information pieces are transmitted internally one by one. The status information pieces are transmitted in synchronization with e.g. an operating clock of the processing circuit 12 from the storing sites through the exclusive-use signal lines 80 and 81 to the destinations one by one. The memory regions 60 and 61 are formed as e.g. separate sampling registers respectively.

Especially, in this embodiment, a second register part 14 for storing individual information pieces unique to the semiconductor device 1 is provided for the sake of test or debug convenience. Examples of the unique information include the lot number of the wafer from which the semiconductor device 1 was manufactured and a lot information piece such as a chip address on the wafer, which can be used for the failure analysis of the semiconductor device 1 or the like, and ID information unique to a user of the semiconductor device 1. The second register part 14 has: a specific memory region 70 for storing information pieces such as the lot number and the chip address as described above; and a specific memory region 71 for storing ID information unique to the user, etc. On the memory regions 70 and 71, corresponding information pieces in a non-volatile memory (NVM) 16 are initially set e.g. as a part of a power-on reset process on the semiconductor device 1. The control part 11 performs a write on the non-volatile memory 16 based on an overwrite command from the host device 4. The memory regions 70 and 71 are formed as e.g. separate sampling registers respectively.

The test control part 13 includes a circuit that controls a readout from the first register part 15 and the second register part 14. In the event of a test enable direction through the test enable terminal TESTIN, the test control part 13 performs control so as to repeat the action of selecting status information pieces held by the first register part 15, and the individual information pieces held by the second register part 14 in series and outputting the selected information pieces from the test output terminals DATA_G[7:0] one by one according to a predetermined output format. In addition, in the event of a test disable direction through the test enable terminal TESTIN, the test control part 13 performs the control in which the action of selecting, in series, the status information pieces and the individual information pieces is suspended and in this state, the same status information pieces or individual information pieces are output from the test output terminals DATA_G[7:0] without interruption. Although no special restriction is intended, the test control part 13 has: a sequencer 50; a counter 51; and a selector 52. The sequencer 50 causes the counter 51 to count up in a wraparound method in response to a test enable direction, and causes the counter 51 to suspend the count-up in response to a test disable direction. For instance, in the case of causing the counter 51 to count up while managing four bits of the counter, the counter counts up from an initial value of zero (0), as a cardinal point, to a final value of 15 and then, goes back to the value of zero (0) and thereafter repeats the counting action. The count value of the counter 51 specifies the memory regions of status information pieces and unique information pieces held by the first and second register parts 15 and 14. The selector 52 selects the memory region specified by the count value of the counter 51, and reads the status information piece from the first register part 15, or the unique information piece from the second register part 14. The information pieces thus read out are output from the test output terminals DATA_G[7:0] in turn. Especially, in this embodiment, a direction from the test enable terminal TESTIN is enabled on condition that a mode signal IM1-0 for specifying an internal mode of the semiconductor device 1 is a predetermined code.

Figure 2:
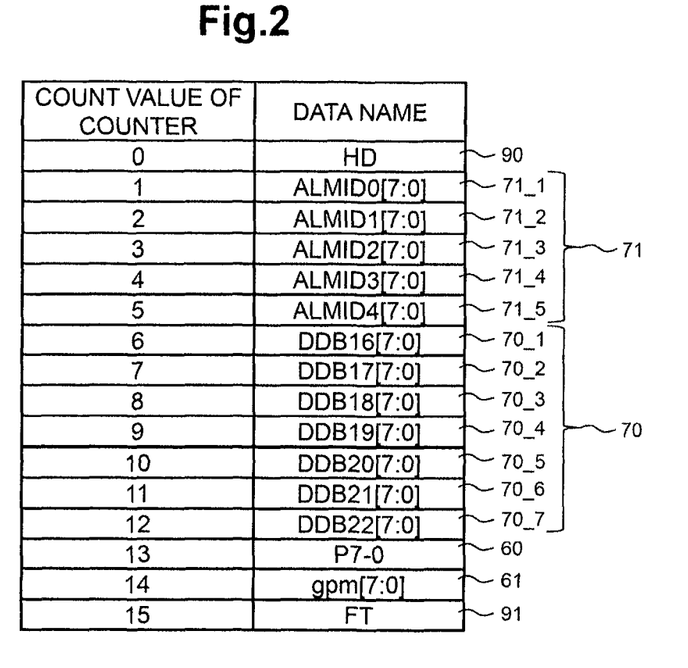
FIG. 2 is an explanatory diagram showing, by example, the relation between a count value of a counter and an output format.
Figure 3:
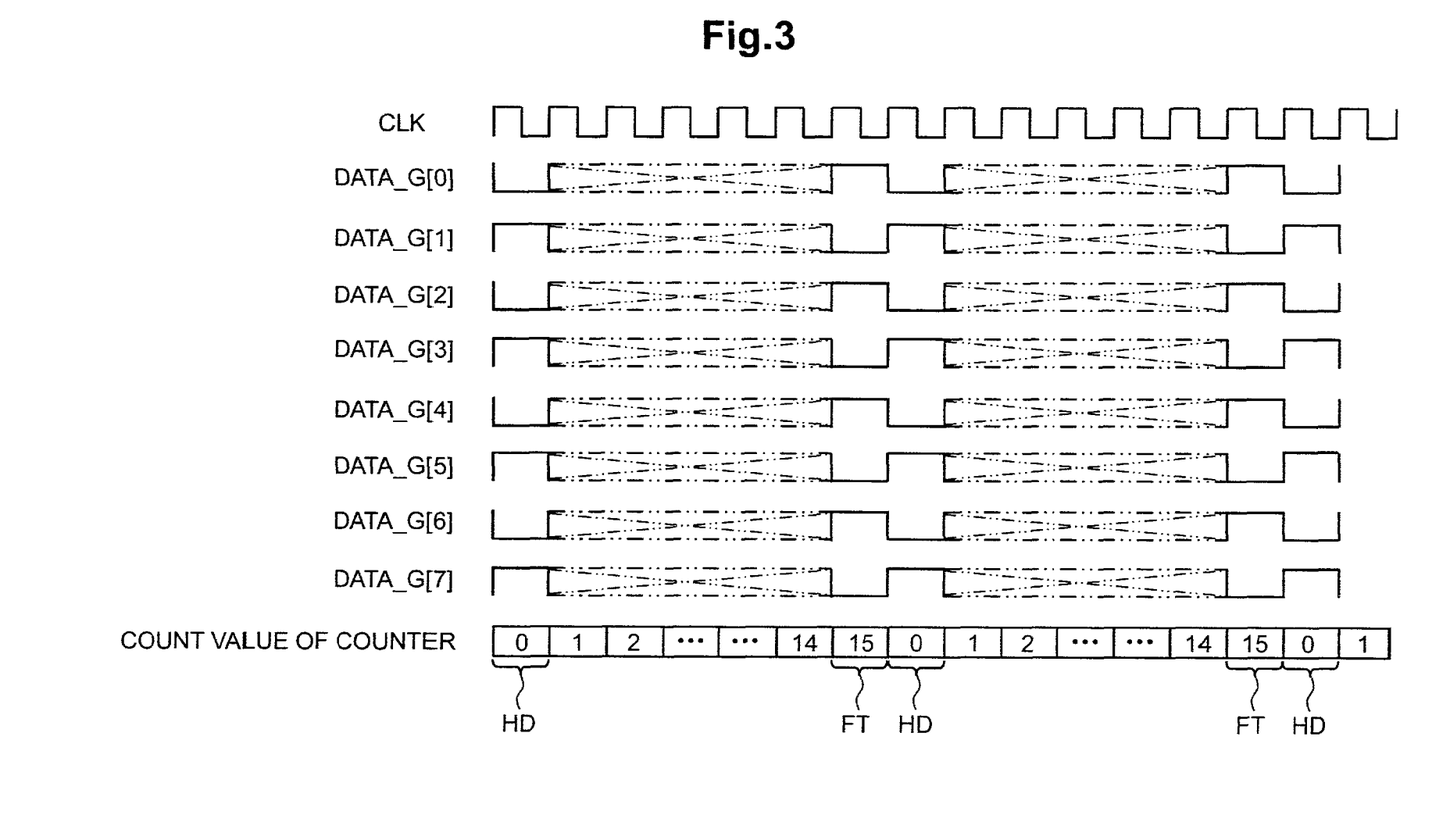
FIG. 3 is a pattern explanatory diagram showing, by example, count values of the counter and outputs of headers and footers.

The output terminals DATA_G[7:0] are constituted by e.g. eight bits, from which the sequencer 50 outputs status information pieces and unique information pieces in a predetermined output format. The output format is formed for each wraparound by the counter 51. FIG. 2 shows, by example, the relation between a count value of the counter and an output format. For instance, in this embodiment, memory regions 60 and 61 for status information pieces are each constituted by one byte (eight bits) in the first register part 15; memory regions 70 (70_1 to 70_7) for lot information pieces are each constituted by a total of seven bytes in the second register part 14; and memory regions 71 (71_1 to 71_5) for ID information pieces are each constituted by a total of five bytes in the second register part 14. For the sake of convenience, a status information piece of the memory region 60 is denoted by P7-0; a status information piece of the memory region 61 is denoted by gpm[7:0]; lot information pieces of the memory regions 70_1 to 70_7 are denoted by DDB16[7:0] to DDB22[7:0]; and ID information pieces of the memory regions 71_1 to 71_5 are denoted by ALMID0[7:0] to ALMID4[7:0]. Although no special restriction is intended, the memory regions 71_1 to 71_5, 70_1 to 70_7, 60 and 61 are assigned byte addresses in ascending order of the array thereof. Further, the output format is a format arranged to have a one-byte header HD added to the top of each of individual information pieces and status information pieces of the memory regions 71_1 to 71_5, 70_1 to 70_7, 60 and 61 of 14 bytes, and a one-byte footer FT added to the end thereof. The sequencer 50 associates count values of 0 to 15 of the counter 51 to a memory region 90 of the header HD, the memory regions 71_1 to 71_5, 70_1 to 70_7, 60 and 61, and a memory region 91 of the footer FT, and the count values of the counter 51 are used to specify byte addresses of the memory regions. FIG. 3 shows, by example, the count values of the counter 51, and outputs of the headers HD and the footers FT. In the diagram, the test output terminals DATA_G[7:0] are expressed as DATA_G[7] to DATA_G[0]. In this example, in the case of the counter 51 having the count value of 0, headers HD of a pattern of 01010101 are output from the test output terminals DATA_G[7] to DATA_G[0]. In the case of the counter value of 15, footers FT of a pattern 10101010 are output from the test output terminals DATA_G[7] to DATA_G[0]. As to output patterns of individual information pieces and status information pieces, the graphic representation thereof is omitted. It is noted that CLK represents a synchronizing clock of the test control part, which is the same as e.g. the operating clocks of the control part 11 and the processing part 12.

Figure 4:
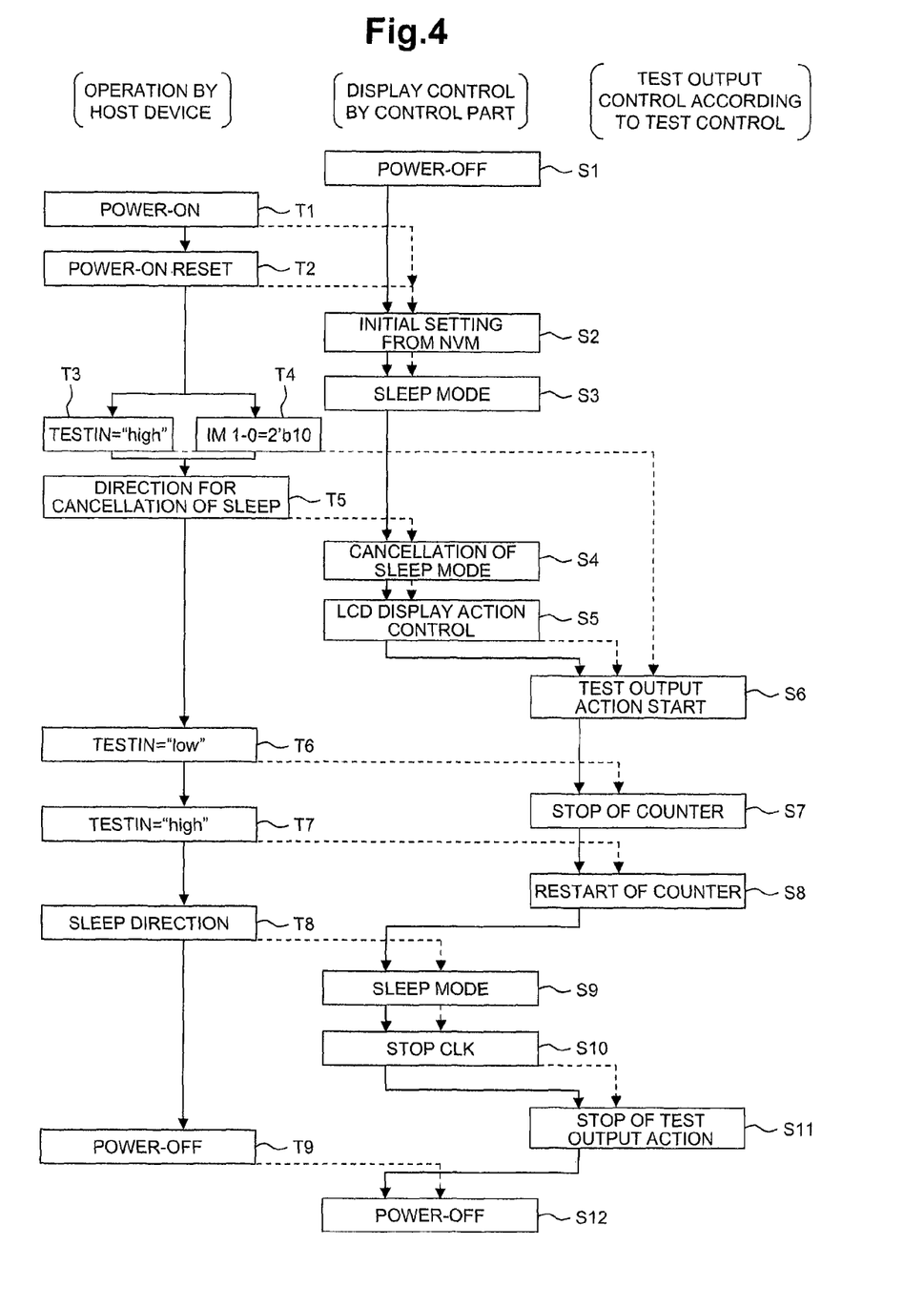
FIG. 4 is a flow chart showing, by example, action flows of a display driver.

FIG. 4 shows, by example, action flows of the display driver. In the diagram, an operation by the host device 4, display control by the control part 11, and test output control by the test control part 13 are separately shown.

First, a power-on direction (T1) on the semiconductor device 1 staying in a power-off state (S1) leads to a power-on reset direction of the semiconductor device 1 (T2). As a result, information pieces stored in the non-volatile memory 16 are initially set in the memory regions 70, 71 of the second register part 14 and the control register in the control part 11 (S2). After that, the LCD driver 2 is brought into a sleep state (S3).

Then, the host device 4 supplies a predetermined code (2'b10) as a mode signal IM1-0 (T4), and brings the test enable terminal TESTIN to High level, thereby directing the test enable (T3). In this way, the test control part 13 is allowed to work. Further, the cancellation of a sleep mode of the LCD driver 2 by the host device 4 enables the action for LCD display control in synchronization with internal operating clocks (S5). Specifically, the control part 11 and the processing part 12 start the control for displaying image data on the LCD panel 3 in response to commands provided to the interface part 10 by the host device 4.

After the start of the display control, status information pieces are held by the error register 22 and the status register 30 according to the action sequentially. The status information pieces by the error register 22 and the status register 30 are stored in the registers 60 and 61 of the first register part 15 in synchronization with the operating clocks sequentially. The test control part 13 automatically repeats the test output action (S6). The test output action refers to an action by which a count value of the counter 51 arranged to perform a counting action according to the wraparound technique is used as an address to cause the selector 52 to select, by byte, the memory regions of the first register part 15 and the second register part 14, and the selected information pieces are output, by byte, from the test output terminals DATA_G[7:0] in series one by one according to the output format. The test output terminals DATA_G[7:0] are connected with a tester or debugger, which is not shown in the diagram, and the outputs from the test output terminals DATA_G[7:0] are supplied for the test or debug.

In the course thereof, the counting action of the counter 51 is interrupted by changing the test enable terminal TESTIN to Low level (T6). In the event of such interruption, the state selected by the selector 52 based on the count value at that time is fixed, byte data output from the test output terminals DATA_G7 to DATA_G0 remain the same memory region data as those selected at the interruption (T7). Therefore, in the case of desiring to monitor the transition of desired byte data in the status register 30 or the error register 22 at all times, it is sufficient to just interrupt the counting action of the counter in line with the timing of selecting a memory region in the first register part 15 or the second register part 14 which holds the byte data. After that, the counting action of the counter 51 is resumed by turning the test enable terminal TESTIN to High level (T7) and again, information pieces stored in the first register part 15 and the second register part 14 will be cyclically output from the test output terminals DATA_G7 to DATA_G0 one by one.

In case that the host device 4 issues a direction for sleep (T8), a sleep mode is set on the LCD driver 2 (S9), and internal operation clock signals are stopped (S10). As a result, the test output action by the test control part 13 is stopped (S11). In case that the host device 4 issues a direction for power-off, the power source of the semiconductor device 1 is cut off (S12).

Figure 5:
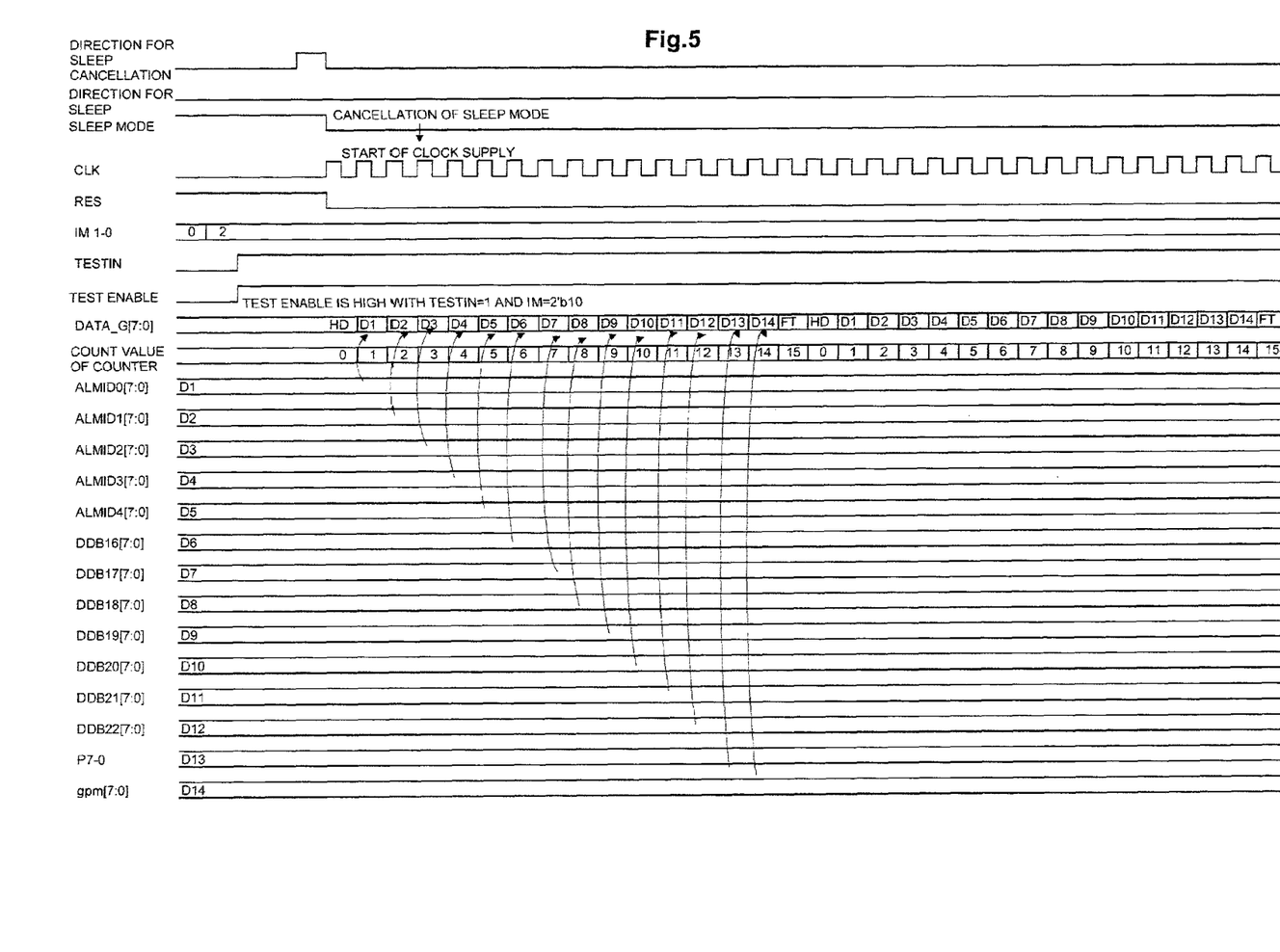
FIG. 5 is a group of timing charts showing, by example, a first half part of a test output action of the display driver.
Figure 6:
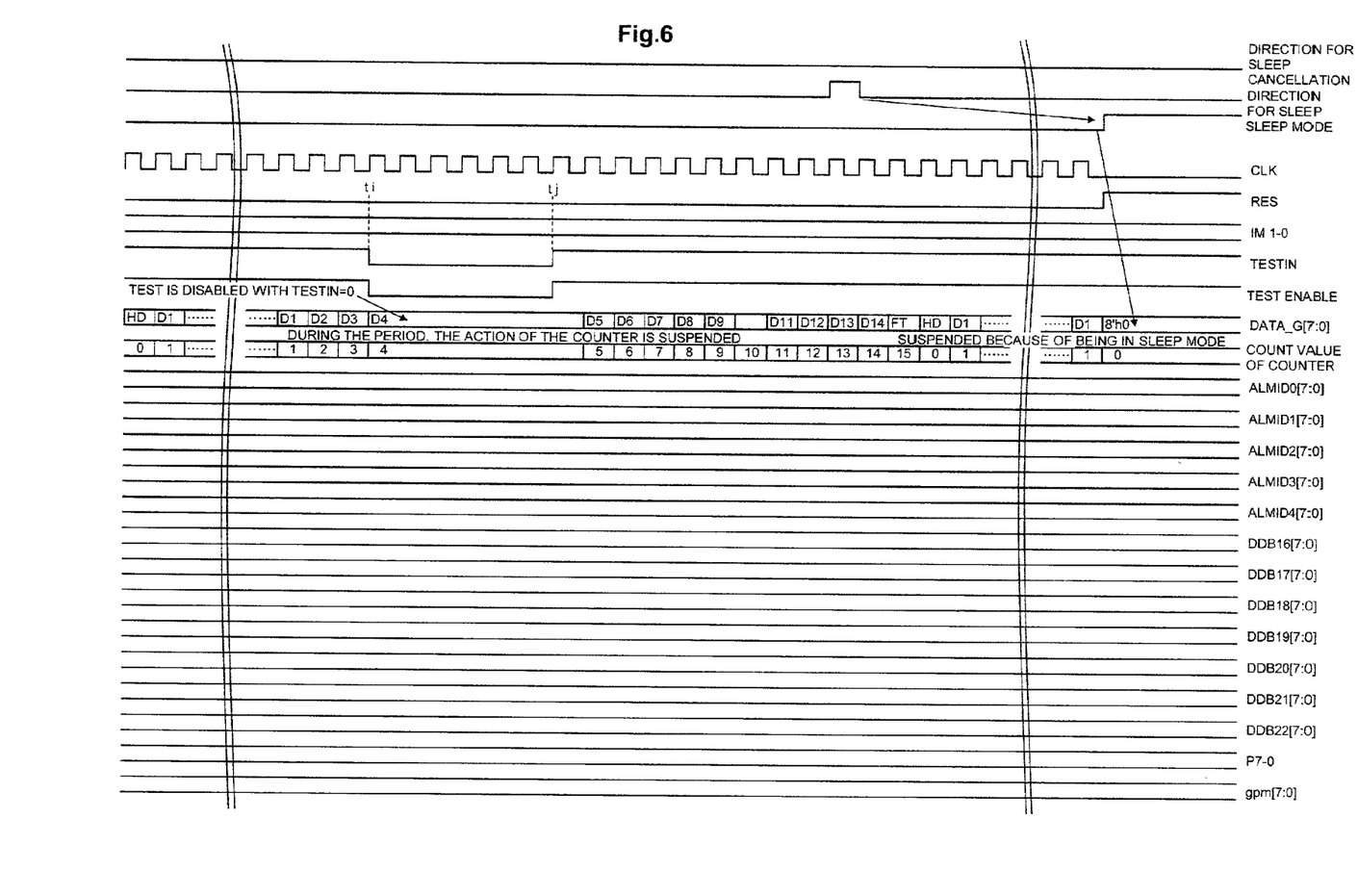
FIG. 6 is a group of timing charts showing, by example, a second half part of the test output action.

FIGS. 5 and 6 present timing charts showing, by example, the test output action of the display driver. The timing charts of those diagrams are continuous with each other; the end of each timing chart of FIG. 5 connects with the top of the corresponding timing chart of FIG. 6; and the timing charts are connected with each other. In the RES represents a power-on reset signal of the semiconductor device 1. In FIG. 6, at the time ti, the test enable terminal TESTIN is turned to Low level, and the counting action of the counter 51 is suspended, when the count value is four. While the counting action remains stopped, the outputs of data D4 selected according to the count value are output from the test output terminals DATA_G[7:0] without interruption. After that, the test enable terminal TESTIN is turned to High level again at the time tj, the counting action of the counter 51 is resumed, and data selected according to the count value updated in turn are output from the test output terminals DATA_G[7:0] one by one.

The effects and advantages achieved by the semiconductor device 1 are as follows.

(1) Specifying the test enable, existing status information pieces stored in the first register part 15 are cyclically output from the test output terminals DATA_G[7:0] according to an predetermined procedure one by one. In contrast, specifying the test disable, the same information pieces as status information pieces which have been output from the test output terminals DATA_G[7:0] are output with that timing without interruption. Therefore, the following are made possible by just operating the test enable terminal without the need for initial setting: to cyclically output status information pieces; and to output only a desired status information piece without interruption. This can contribute to the test facilitation of a semiconductor device.

(2) Further, specifying the test enable, individual information pieces, such as lot information, stored in the second register part 14 are cyclically output from the test output terminals DATA_G[7:0] according to a predetermined procedure one by one. In contrast, specifying the test disable, the same information pieces as individual information pieces which have been output from the test output terminals DATA_G[7:0] are output with the timing without interruption. Therefore, the following are made possible by just operating the test enable terminal without the need for initial setting: to cyclically output individual information pieces as well as status information pieces; and to output only a desired status information piece or individual information piece without interruption. This can contribute to the test facilitation of a semiconductor device.

(3) In case that the counting action of the counter 51 is suspended, the state selected by the selector 52 is fixed based on the count value at that time and therefore, byte data output from the test output terminals DATA_G7 to DATA_G0 remain data of the same memory regions. Hence, suspending the counting action of the counter 51 with the timing of selecting a memory region of the first register part 15 or the second register part 14 holding desired byte data in the status register 30 or the error register 22, the transition of the desired byte data can be monitored at all times.

(4) The kinds of individual byte data are never lost how many times the output from the first register part 15 and the output from the second register part 14 are repeated. This is because the top of the output format can be identified by a header HD, and the end thereof can be identified by a footer FT.

(5) On condition that the mode signal IM1-0 for specifying the internal mode of the semiconductor device 1 forms a predetermined code, a direction from the test enable terminal TESTIN is enabled. Therefore, the risk that a test could be enabled by mistake can be reduced.

Second Embodiment

While in the above first embodiment, the semiconductor device includes both of the first register part 15 and the second register part 14, the semiconductor device may be arranged to include only the first register part 15. With such an embodiment, information pieces stored in the non-volatile memory 16 need to be read out through the control signal interface 21 to the outside. In this case, it is required to accept the following fact: to perform an operation for reading out internal information to the outside according to a protocol such as MIPI-DBI per se is troublesome; and it is difficult to read out such information pieces in real time in parallel with the display control during a debug or test.

In this embodiment, what can be read out under the control of the test control part 13 is only a status information pieces through the first register part 15. Other effects and advantages achieved by the second embodiment are the same as those in the first embodiment, so the detailed descriptions thereof are omitted here.

While the invention made by the inventor has been specifically described based on the embodiments above, the invention is not limited to the embodiments. It is obvious that various changes or modifications thereof may be made without departing from the subject matter thereof.

For instance, the semiconductor device may be arranged to include a touch panel controller or local processor, which is not shown, for performing the control to detect an operation on an electrostatic capacitance-type touch panel formed on a surface of the LCD panel 3 which is controlled in display by the LCD driver 2. For instance, the local processor is used for e.g. calculating coordinates subjected to a touch operation based on information of detected position output by the touch panel controller.

While in FIGS. 5 and 6, the cycle of clocks CLK is shown as if identical to the cycle of counting by the counter 50, it is not so limited. The counter clock for the counter 50 may be identical to the cycle of clock signals resulting from the frequency division of clocks CLK for internally synchronized action.

The processing circuit of the semiconductor device is not limited to a circuit used for activation control of a liquid crystal display panel, whereas it may be a circuit used for display activation control of an electroluminescence panel. Further, the processing circuit may be arranged to have another processor peripheral processing function, e.g. an image coding-and-decoding function, an audio processing function, an encryption processing function, or a DMA (Direct Memory Access) function.

In addition, concrete information kinds of status information pieces and individual information pieces are not limited to those in the above embodiments. They may be appropriately determined according to e.g. the detail of processing by the processing circuit.

What is claimed is:

1. A semiconductor device, comprising:
   a processing part configured to process data received through an interface part, and configured to output resultant data;
   a control part configured to control the processing part based on control data received through the interface part;
   a first register part configured to receive status information pieces from the interface part and the control part in parallel while the processing part processes the data; and
   a test control part including a sequencer, a counter and a selector,
   wherein the sequencer is configured to cause the counter to perform a counting action according to a wraparound technique in response to a test enable terminal being set to a level corresponding to a test enable direction, and cause the counter to suspend the counting action in response to the test enable terminal being set to a level corresponding to a test disable direction,
   wherein the selector is configured to cyclically select the status information pieces held by the first register part in response to a count value of the counter, and read out the selected status information pieces from the first register part,
   wherein the selected status information pieces read out from the first register part are output one by one to an external device.

2. The semiconductor device according to claim 1, wherein the first register part includes memory regions receiving the status information pieces from internal registers of the interface part and the control part through respective exclusive-use signal lines.

3. The semiconductor device according to claim 1, wherein the status information pieces are output to the external device in a predetermined output in which a header information piece is added to the top of a group of the status information pieces selected from the first register part in each selection round and a footer information piece is added to the end of the group.

4. The semiconductor device according to claim 1, wherein the processing part is configured to output display drive signals for displaying an image on a liquid crystal display panel based on image data input from the interface part.

5. The semiconductor device according to claim 1, wherein the test control part is configured to enable the test enable direction and the test disable direction received through the test enable terminal on condition that a mode signal for specifying an internal mode of the semiconductor device is in a predetermined state.

6. A semiconductor device, comprising:
   a processing part configured to process data received through an interface part, and configured to output resultant data;
   a control part configured to control the processing part based on control data received through the interface part;
   a first register part configured to receive status information pieces from the interface part and the control part in parallel while the processing part processes the data;
   a second register part configured to receive individual unique information pieces unique to the semiconductor device; and
   a test control part including a sequencer, a counter and a selector,
   wherein the sequencer is configured to cause the counter to perform a counting action according to a wraparound technique in response to a test enable terminal being set to a level corresponding to a test enable direction, and cause the counter to suspend the counting action in response to the test enable terminal being set to a level corresponding to a test disable direction,
   wherein the selector is configured to cyclically select the status information pieces held by the first register part and the unique information pieces held by the second register part in response to a count value of the counter, and read out the selected information pieces selected from the status information pieces and unique information pieces from the first and second register parts,
   wherein the selected information pieces read out from the first and second register parts are output one by one to an external device.

7. The semiconductor device according to claim 6, wherein the first register part includes memory regions receiving the status information pieces from, which internal registers of the interface part and the control part through respective exclusive-use signal lines.

8. The semiconductor device according to claim 6, further comprising a nonvolatile memory device storing the unique information pieces, wherein the unique information pieces are initially set on the second register part from the nonvolatile memory device by a power-on reset process of the semiconductor device.

9. The semiconductor device according to claim 6, wherein the status information pieces are output to the external device in a predetermined output format in which a header information piece is added to the top of a group of the status and unique information pieces selected from the first and second register parts in each selection round and a footer information piece is added to the end of the group.

10. The semiconductor device according to claim 6, wherein the processing part is configured to output display drive signals for displaying an image on a liquid crystal display panel based on image data input from the interface part.

11. The semiconductor device according to claim 6, wherein the test control part is configured to enable a the test enable direction and the test disable direction received through the test enable terminal on condition that a mode signal for specifying an internal mode of the semiconductor device is in a predetermined state.

12. A method for operating an LCD driver, the method comprising:
 outputting, from a processing part, pixel drive signals to an LCD display in response to image data supplied to the processing part;
 receiving, while the processing part is driving the LCD display, in parallel status information pieces from an interface part and a control part by a first register part;
 receiving unique information pieces from a non-volatile memory by a second register part;
 causing a counter to perform a counting action according to a wraparound technique in response to a test enable terminal being set to a level corresponding to a test enable direction;
 causing the counter to suspend the counting action in response to the test enable terminal being set to a level corresponding to a test disable direction;
 cyclically selecting the status information pieces held by the first register part and the unique information pieces held by the second register part in response to a count value of the counter;
 reading out the selected information pieces selected from the status information pieces and unique information pieces from the first and second register parts; and
 outputting the selected status information pieces read out from the first register part and the selected unique information pieces read out from the second register part one by one to an external device.

13. The method of claim 12, wherein receiving the status information pieces from the interface part and the control part comprises:
 receiving the status information pieces from an error register and a status register.

14. The method of claim 12, further comprising:
 enabling receipt of the test disable direction and the test enable direction in response to a mode signal for specifying an internal mode of processing part.

15. The method of claim 14, further comprising:
 receiving the mode signal from a host device.

* * * * *

UNITED STATES PATENT AND TRADEMARK OFFICE
CERTIFICATE OF CORRECTION

PATENT NO. : 9,837,027 B2
APPLICATION NO. : 14/972660
DATED : December 5, 2017
INVENTOR(S) : Akihito Kumamoto et al.

Page 1 of 1

It is certified that error appears in the above-identified patent and that said Letters Patent is hereby corrected as shown below:

In Claim 11, delete "a the" and insert -- the --, therefor.

Signed and Sealed this
Fourteenth Day of August, 2018

Andrei Iancu
*Director of the United States Patent and Trademark Office*